United States Patent
Hsu et al.

(10) Patent No.: US 7,495,479 B1
(45) Date of Patent: Feb. 24, 2009

(54) SAMPLE AND HOLD CIRCUIT AND RELATED DATA SIGNAL DETECTING METHOD UTILIZING SAMPLE AND HOLD CIRCUIT

(75) Inventors: Jen-Chien Hsu, Tai-Chung (TW); Hung-Wen Lu, Taoyuan County (TW); Chau-Chin Su, Taipei (TW); Yeong-Jar Chang, Taichung County (TW)

(73) Assignee: Faraday Technology Corp., Hsin-Chu (TW)

( * ) Notice: Subject to any disclaimer, the term of this patent is extended or adjusted under 35 U.S.C. 154(b) by 0 days.

(21) Appl. No.: 11/854,560

(22) Filed: Sep. 13, 2007

(51) Int. Cl.
  *H03K 17/00* (2006.01)
(52) U.S. Cl. .......................... 327/94; 327/96
(58) Field of Classification Search ........................ None
  See application file for complete search history.

(56) References Cited

U.S. PATENT DOCUMENTS

| | | | | |
|---|---|---|---|---|
| 7,177,610 B2* | 2/2007 | Scott et al. | .................. | 455/259 |
| 7,279,941 B2* | 10/2007 | Yonezawa et al. | ........... | 327/101 |
| 7,312,783 B2* | 12/2007 | Oyama | ........................ | 345/102 |
| 7,332,916 B2* | 2/2008 | Nagata | ........................ | 324/713 |
| 2003/0117676 A1* | 6/2003 | Nakamura et al. | ........... | 358/513 |
| 2007/0052452 A1* | 3/2007 | Chou et al. | .................... | 327/94 |

* cited by examiner

*Primary Examiner*—Cassandra Cox
(74) *Attorney, Agent, or Firm*—Winston Hsu (57) ABSTRACT

Disclosed is a sample and hold circuit for detecting a parameter of a data signal, which includes: a first switching module, wherein the sample and hold circuit samples the data signal according to the turning on or off of the first switching module; at least one capacitor, coupled to the first switching module; a second switching module, coupled to the capacitor; a controllable reference voltage source, for providing a first reference voltage to charge/discharge the capacitor via the second switching module according to a control signal; a first comparator, coupled to the capacitor, for comparing a voltage drop on the capacitor and the first reference voltage to generate a first comparing result; and a control circuit, coupled to the controllable reference voltage source and the first comparator, for generating the control signal according to the comparing results.

14 Claims, 12 Drawing Sheets

SAMPLE AND HOLD CIRCUIT AND RELATED DATA SIGNAL DETECTING METHOD UTILIZING SAMPLE AND HOLD CIRCUIT

BACKGROUND OF THE INVENTION

1. Field of the Invention

The present invention relates to a sample and hold circuit and a related data signal detecting method utilizing the sample and hold circuit, and particularly relates to a sample and hold circuit for detecting height of an eye diagram and a related data signal detecting method utilizing said sample and hold circuit.

2. Description of the Prior Art

Figure 1A:
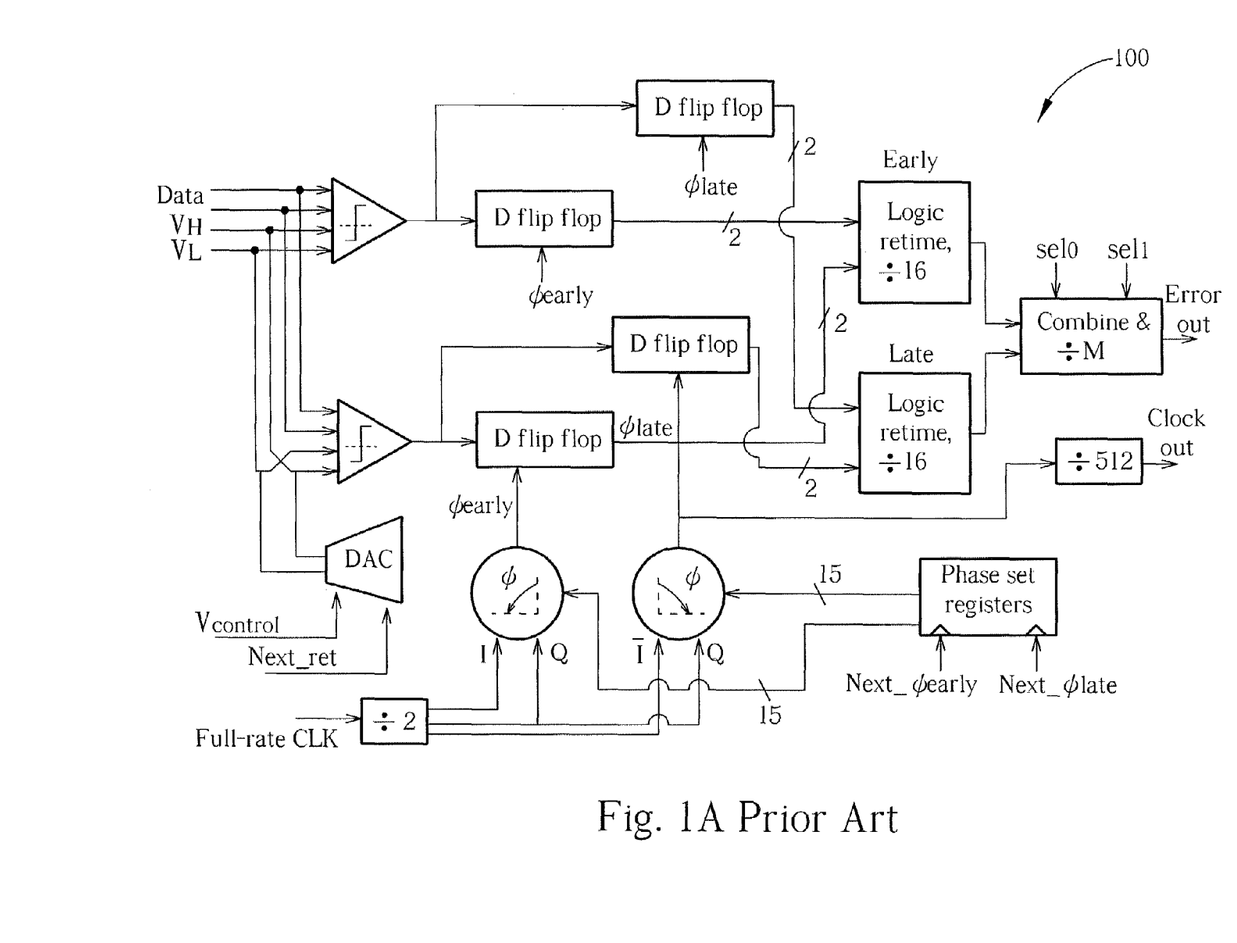
FIG. 1A is a circuit diagram illustrating a prior art eye diagram measuring circuit 100.

Normally, an eye diagram is used to indicate the quality of a signal. Therefore, the width and height of an eye diagram are important parameters for the signal. FIG. 1A is a circuit diagram illustrating a prior art eye diagram measuring circuit 100. As shown in FIG. 1A, the eye diagram measuring circuit 100 operates at high speed and needs high speed elements, i.e. the comparator, phase interpolator and D flip-flops. The cost of the eye diagram measuring circuit 100 is high and the yield is low since it has high speed elements.

Figure 1B:
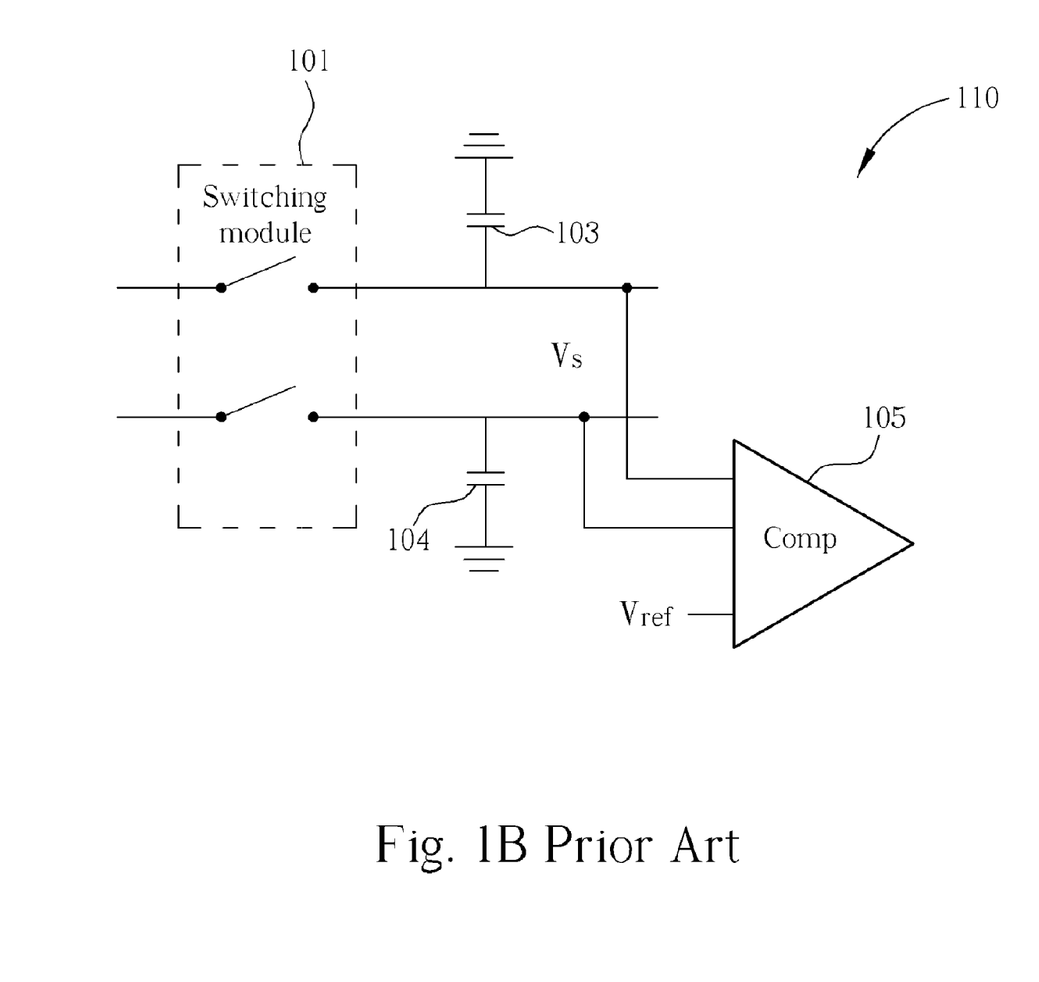
FIG. 1B is a circuit diagram illustrating a prior art sample and hold circuit.

FIG. 1B is a circuit diagram illustrating a prior art sample and hold circuit 110. As shown in FIG. 1B, the sample and hold circuit includes a switching module 101, two capacitors 103, 104 and a comparator 105. The switching module 101 is used for sampling the data signal according to the turning on or turning off of said switching module 101. The capacitors 103, 104 are used for storing the sampled value, and the comparator 105 is used for comparing the sampled value and a reference voltage. However, since the bandwidth of the sample and hold circuit 100 and the speed of the comparator 105 are limited, the sampled value may be different from the actual data signal, and some error of the sampling value may occur accordingly.

SUMMARY OF THE INVENTION

An objective of the present invention is therefore to provide a sample and hold circuit and a related method for detecting a parameter of a data signal, which utilizes a reference voltage to approach the height of a data signal gradually, in order to obtain the eye diagram height of the data signal.

Another objective of the present invention is to provide a sample and hold circuit and a related method for measuring the eye diagram width of the data signal by utilizing a digital controlled delay line (DCDL).

Still another objective of the present invention is to provide a sample and hold circuit and a related method for omitting a data signal that does not match specifications by referring to a specific voltage.

One embodiment of the present invention discloses a sample and hold circuit for detecting a parameter of a data signal, which comprises: a first switching module, wherein the sample and hold circuit samples the data signal according to the turning on or off of the first switching module; at least one capacitor, coupled to the first switching module; a second switching module, coupled to the capacitor; a controllable reference voltage source, for providing a first reference voltage to charge/discharge the capacitor via the second switching module according to a control signal; a first comparator, coupled to the capacitor, for comparing a voltage drop on the capacitor and the first reference voltage to generate a first comparing result; and a control circuit, coupled to the controllable reference voltage source and the first comparator, for generating the control signal according to the first comparing result. The sample and hold circuit according to the present invention can further comprise: a second comparator, coupled to the capacitor, for comparing the data signal and a second reference voltage to generate a second comparing result; and a decision circuit, coupled to the first comparator and the second comparator, for validating the data signal according to the first comparing result and the second comparing result. The sample and hold circuit according to the present invention can also comprise: a digital controlled delay line, for receiving a clock signal and delaying the clock signal to generate a desired clock signal according to a control word; and a pulse generator, coupled to the digital controlled delay line, the first switching module and the second switching module, for generating pulse signals to control the first switching module and the second switching module according to the desired clock signal to adjust the sampling time of the sample and hold circuit.

Another embodiment of the present invention discloses a data signal detecting method for detecting a parameter of a data signal, which comprises: (a) providing a first reference voltage; (b) sampling the data signal to generate a sampled value; (c) comparing the sampled value and the first reference voltage; (d) repeating the step (a), and the step (b) and the step (c) for a predetermined times; (e) decreasing the first reference voltage if the reference voltage is higher than any of the sampled value; increasing the first reference voltage if the first reference voltage is lower than all the sampled values. Other characteristics of the data signal detecting method can be obtained according to the above-mentioned circuit, and are thus omitted for brevity.

According to the above-mentioned circuit and structure, since the capacitor is pre-charged before the sample and hold circuit samples a data signal, the sampling problem for high speed is improved, and a comparator with lower speed can be used. Also, low and high levels of the data signal can be easily determined by application of only two comparators and reference voltages according to the present invention. Furthermore, the width of the eye diagram can be easily measured by utilizing the DCDL.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the description and following claims to refer to particular components. As one skilled in the art will appreciate, electronic equipment manufacturers may refer to a component by different names. This document does not intend to distinguish between components that differ in name but not function. In the following description and in the claims, the terms "include" and "comprise" are used in an open-ended fashion, and thus should be interpreted to mean "include, but not limited to . . . ". Also, the term "couple" is intended to mean either an indirect or direct electrical connection. Accordingly, if one device is coupled to another device, that connection may be through a direct electrical connection, or through an indirect electrical connection via other devices and connections.

Figure 2:
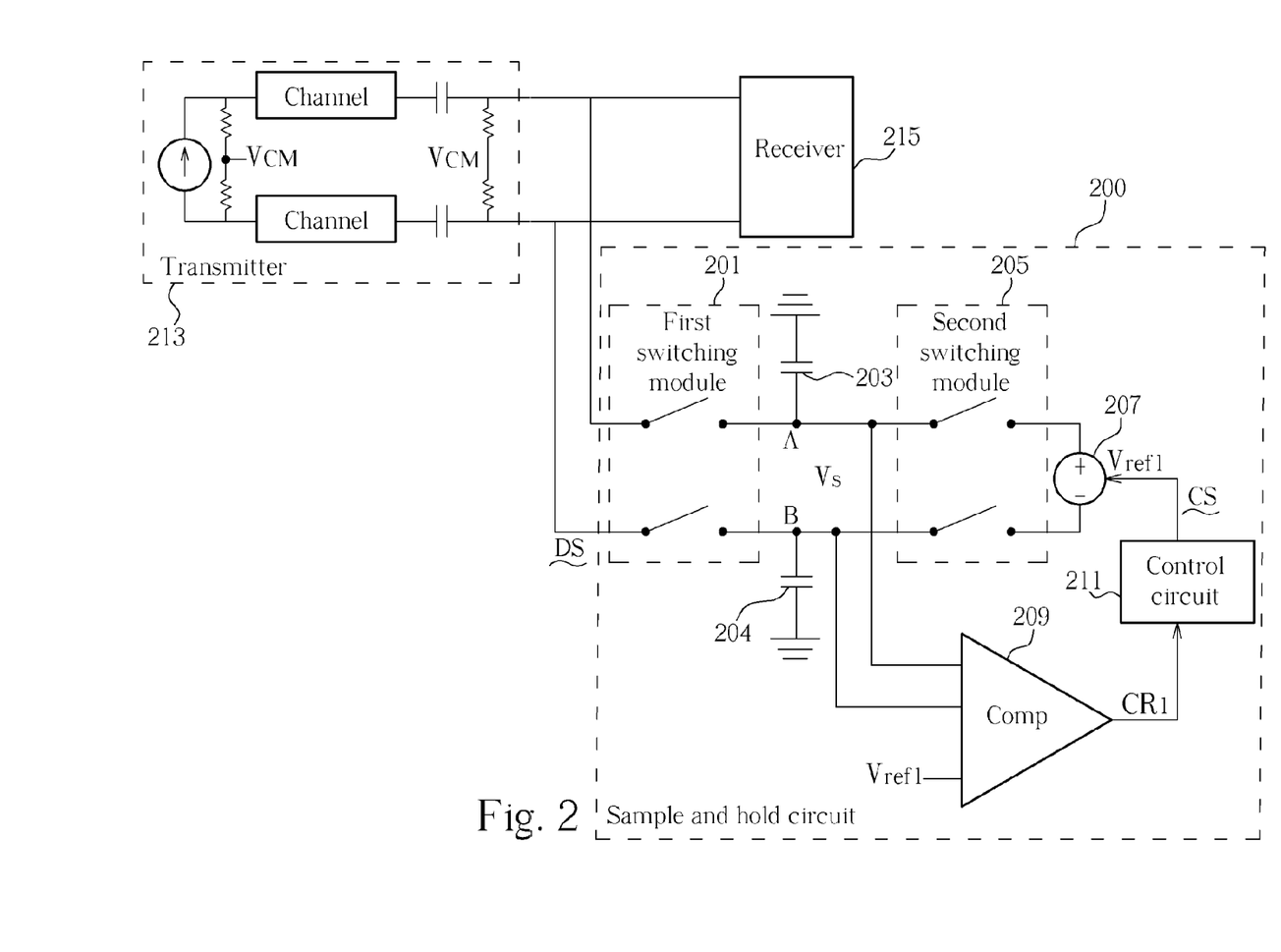
FIG. 2 is a circuit diagram illustrating a sample and hold circuit according to an embodiment of the present invention.

FIG. 2 is a circuit diagram illustrating a sample and hold circuit 200 according to an embodiment of the present invention. In this case, the sample and hold circuit 200 is located between a transmitter 213 and a receiver 215 of a signal, but this is not meant to limit the scope of the present invention. The sample and hold circuit 200 can, of course, be provided in other positions and be utilized for other applications. As shown in FIG. 2, the sample and hold circuit 200 comprises a first switching module 201, two capacitors 203, 204, a second switching module 205, a controllable reference voltage 207, a comparator 209 and a control circuit 211. The sample and hold circuit 200 samples a data signal DS according to the turning on or off of the first switching module 201. The controllable reference voltage source 207 is used for providing a first reference voltage $V_{ref1}$ to charge/discharge the capacitors 203, 204 via the second switching module 205 according to a control signal CS. The first comparator 209 is used for comparing a voltage drop $V_s$ on the capacitor 203, 204 and the first reference voltage $V_{ref1}$ to generate a first comparing result $CR_1$. The control circuit 211 is used for generating the control signal CS according to the first comparing result $CR_1$.

Figure 3:
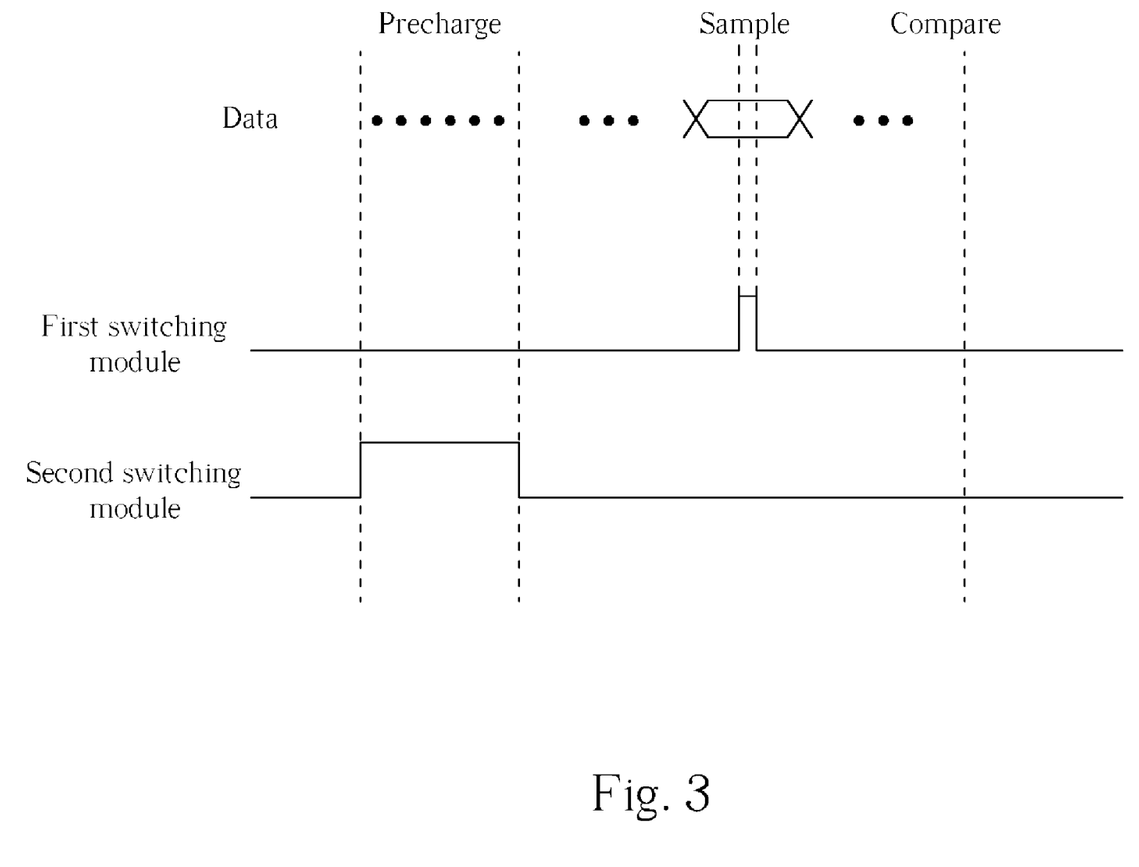
FIG. 3 is a schematic diagram illustrating the operation timing of the sample and hold circuit shown in FIG. 2.

The operation of the sample and hold circuit 200 is summarized as follows. Initially, the second switching module 205 is turned on (conductive) and the first switching module 201 is turned off (non-conductive), such that the capacitor 203 is pre-charged to the first reference voltage $V_{ref1}$. Then the first switching module 201 is turned on and the second switching module 205 is turned off, such that the sample and hold circuit 200 samples the data signal DS via the first switching module 201 to generate a sampled value. After that, the comparator 209 compares the sampled value and the first reference voltage $V_{ref1}$ to generate the first comparing result $CR_1$. FIG. 3 is a schematic diagram illustrating the operation timing of the sample and hold circuit 200 shown in FIG. 2. According to FIG. 3, the timing relation between pre-charging, sampling, and comparing can be defined more clearly. The pre-charging, sampling and comparing steps can be repeated for specific times to generate a set of comparing results, but it does not mean to limit the scope of the present invention.

Next, the control circuit 211 generates the control signal CS to control the controllable reference voltage 207 according to the comparing results $CR_1$. The controllable reference voltage 207 decreases the first reference voltage $V_{ref1}$ if the first reference voltage $V_{ref1}$ is higher than any of the sampled value and increases the first reference voltage $V_{ref1}$ if the first reference voltage $V_{ref1}$ is lower than all the sampled values. In one embodiment, such steps will be repeated until the first reference voltage $V_{ref1}$ is almost equal to the minimum sampled value. In this way, the height of the data signal DS (that is, the height of the eye diagram of the data signal DS) can be obtained.

Figure 4:
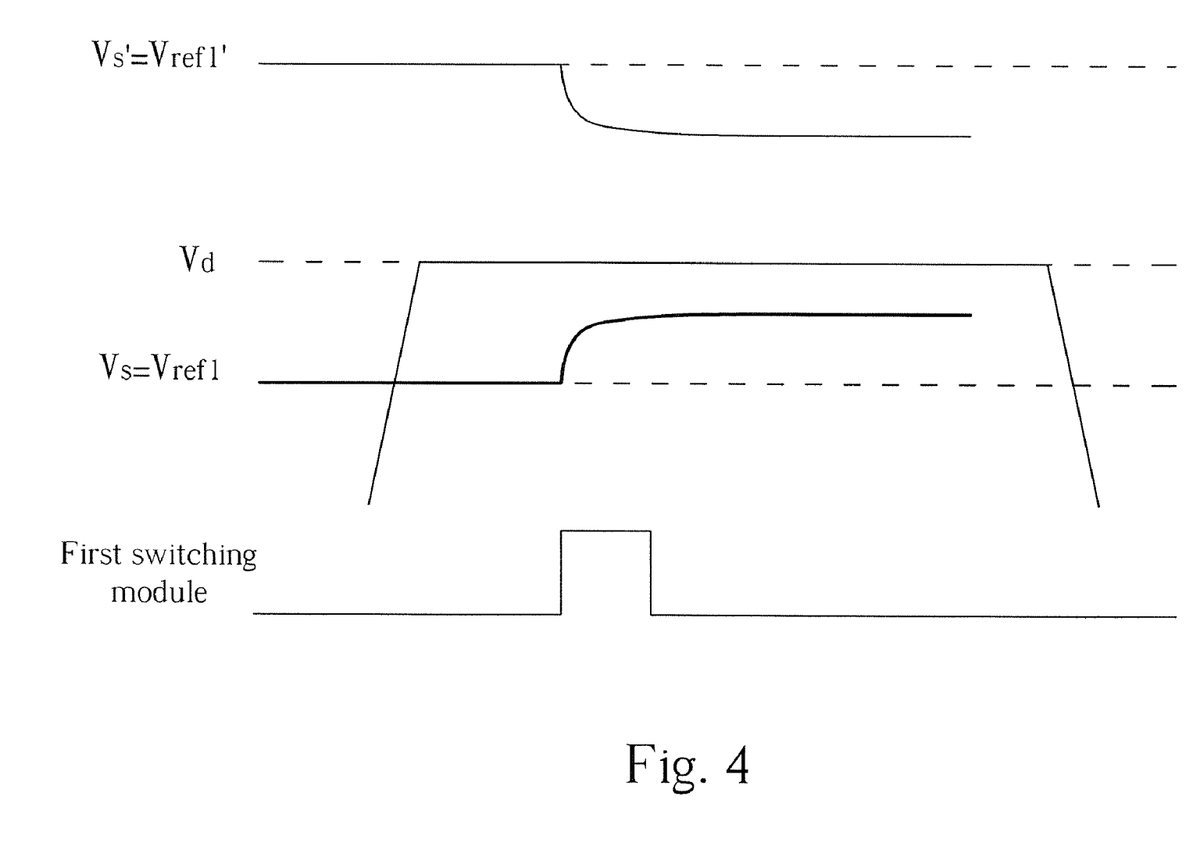
FIG. 4 is a schematic diagram illustrating the comparing operation of the sample and hold circuit shown in FIG. 2.

FIG. 4 is a schematic diagram illustrating the comparing operation of the sample and hold circuit shown in FIG. 2. As shown in FIG. 4, the voltage drop Vs, which equals the first reference voltage $V_{ref1}$, will decrease or increase according to whether it is higher or lower than the sampled value Vd. In this case, the voltage drop Vs on the capacitor 203 meets the rules as follows:

$$V_s = V_{ref} + (V_d - V_{ref})(1 - e^{-T/RC}) = V_{ref} + k(V_d - V_{ref}).$$

Since the operation according to this equation is well known by persons skilled in the art, it is omitted for brevity.

It should be noted that although two capacitors are utilized for explaining the embodiment shown in FIG. 2, it does not mean to limit the scope of the present invention. For example, the sample and hold circuit 200 can utilize only one capacitor between terminal A and B to reach the same function. Such variation should also fall in the scope of the present invention.

Figure 5:
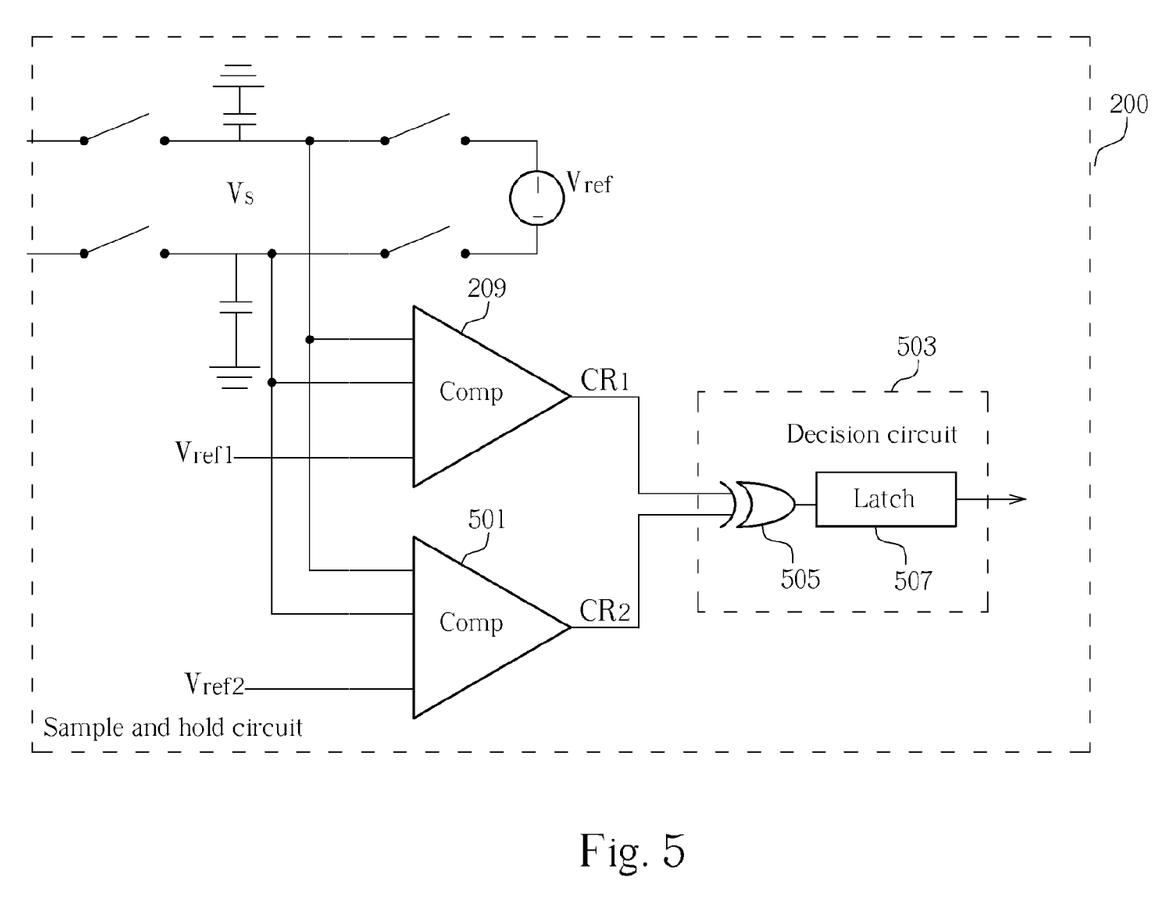
FIG. 5 is a circuit diagram illustrating that the sample and hold circuit shown in FIG. 2 further includes a second reference voltage to determine if the data signal is valid.

FIG. 5 is a circuit diagram illustrating that the sample and hold circuit 200 shown in FIG. 2 further includes a second reference voltage to determine if the data signal is valid. As shown in FIG. 5, the sample and hold circuit 200 further comprises a second comparator 501 and a decision circuit 503. The second comparator 501 is used for comparing the data signal and a second reference voltage $V_{ref2}$ to generate a second comparing result $CR_2$. The decision circuit 503 is used for validating the data signal according to the first comparing result $CR_1$ and the second comparing result $CR_2$. In this embodiment, the second comparator 501 and a decision circuit 503 are used for invalidating the data signal lower than the second reference voltage $V_{ref2}$, and the first reference voltage Vref1 will not be changed for such a situation. In this embodiment, the decision circuit 503 includes an XOR gate 505 and a latch 507, but this is not meant to limit the scope of the present invention. Since the operation of the XOR gate 505 and the latch 507 is well known by persons skilled in the art, related details are omitted for brevity.

Figure 6:
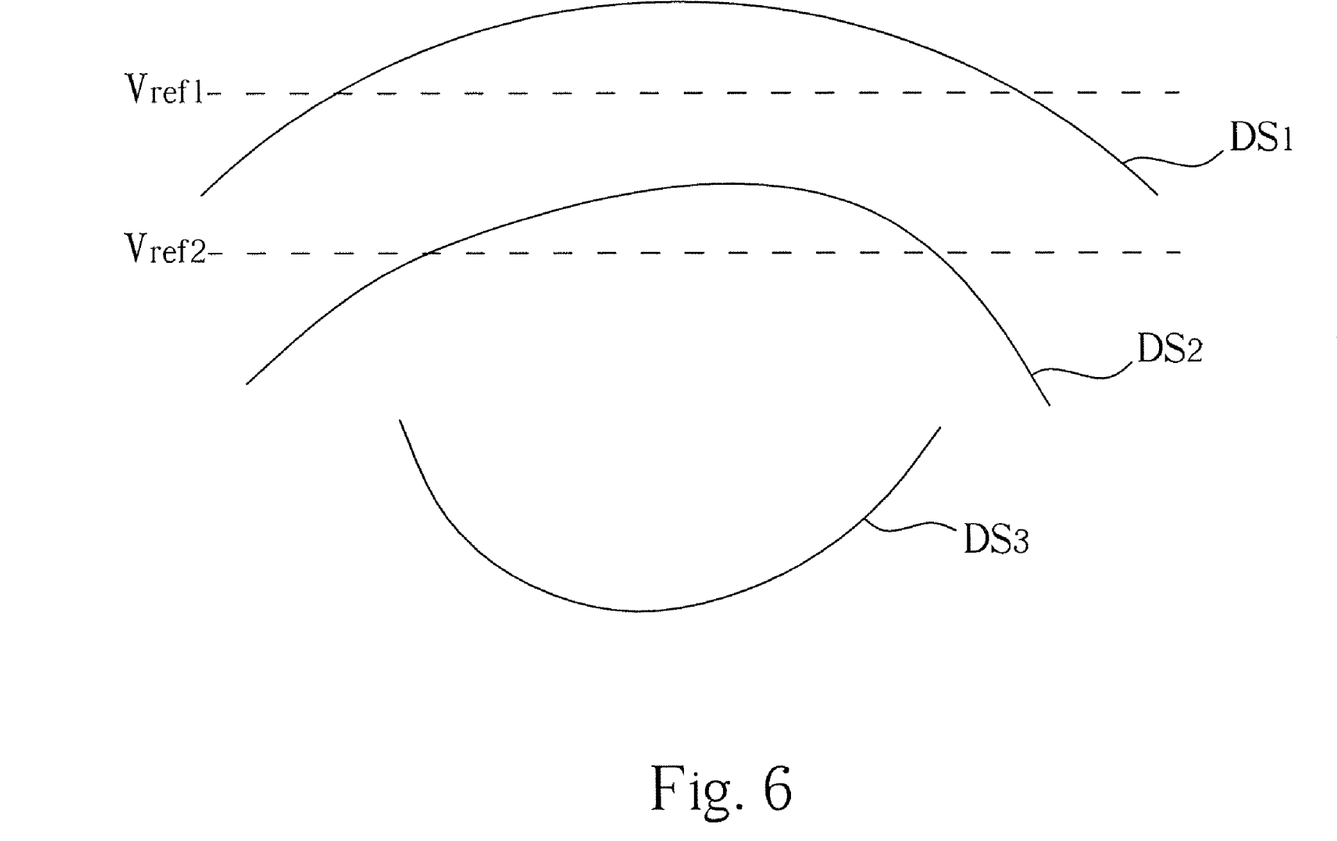
FIG. 6 is a schematic diagram illustrating the operation of the sample and hold circuit shown in FIG. 5.

FIG. 6 is a schematic diagram illustrating the operation of the sample and hold circuit shown in FIG. 5. In FIG. 6, the second reference voltage $V_{ref2}$ is lower than the first reference voltage $V_{ref1}$, and three data signals $DS_1$, $DS_2$, $DS_3$ are taken as examples. As shown in FIG. 6, the data signal $DS_1$ is higher than the first reference voltage $V_{ref1}$, the data signal $DS_2$ is lower than the first reference voltage $V_{ref1}$ but higher than the second reference voltage $V_{ref2}$, and the data signal $DS_2$ is lower than the second reference voltage $V_{ref2}$. In this case, the data signal $DS_1$ is regarded as higher than the first reference voltage $V_{ref1}$, thus the first reference voltage $V_{ref1}$ will be increased as described above. Also, the data signal $DS_2$ is regarded as lower than the first reference voltage $V_{ref1}$, thus the first reference voltage $V_{ref1}$ will be increased as described above. The data signal DS3 is regarded as low level data, so the data signal DS3 will be invalidated such that the first reference voltage $V_{ref1}$ will not be decreased. In other words, the control circuit 211 shown in FIG. 2 will only adjust the first reference voltage $V_{ref1}$ according to the data signal with a high level but will not adjust the first reference voltage $V_{ref1}$ according to the data signal with a low level.

Figure 7:
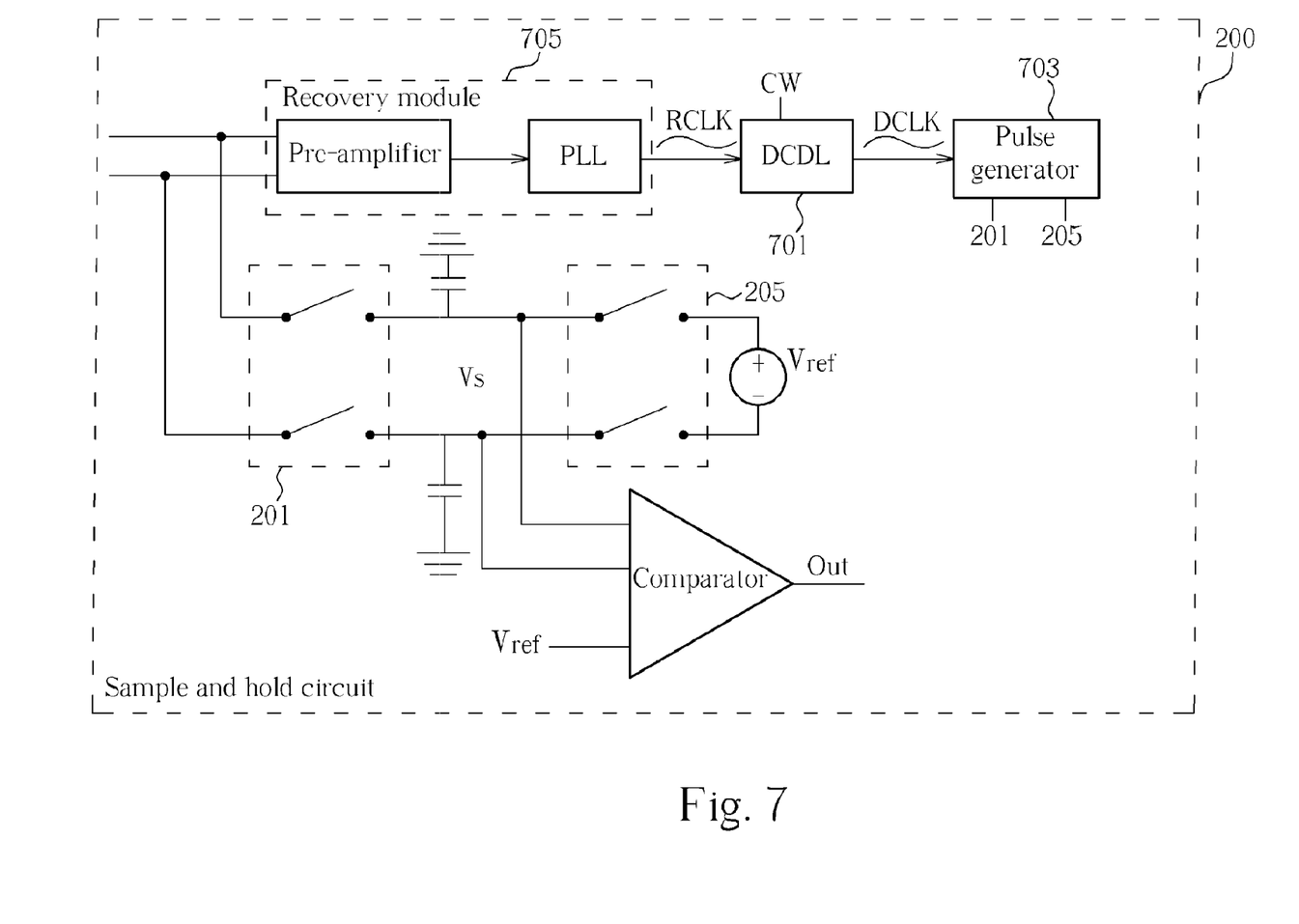
FIG. 7 is a circuit diagram illustrating that the sample and hold circuit shown in FIG. 2 further includes a structure to adjust sampling time.

FIG. 7 is a circuit diagram illustrating that the sample and hold circuit 200 shown in FIG. 2 further includes a structure to adjust sampling time. As shown in FIG. 7, the sample and hold circuit 200 further includes a digital controlled delay line 701 (DCDL) and a pulse generator 703. The digital controlled delay line 701 is used for receiving a recovery clock signal RCLK from a recovery module 705 of the transmitter 213 shown in FIG. 2 and for delaying the recovery clock signal to generate a desired clock signal DCLK according to a control word. The pulse generator 703, which is coupled to the first switching module 201 and the second switching module 205, is used for generating pulse signals to control the first switching module 201 and the second switching module 205 according to the desired clock signal DCLK to adjust the sampling time of the sample and hold circuit 200.

The operation of the sample and hold circuit 200 shown in FIG. 7 is summarized as follows. First, the digital controlled delay line 701 scans the data signal for at least one period, so the relation between the period and a control word CW for controlling the digital controlled delay line 701 will be obtained. Since the period of the data signal is fixed, the relation between the delay amount of the digital controlled delay line 701 and the control word CW can also be obtained. Therefore, the digital controlled delay line 701 can be controlled by the control word CW to generate a desired clock signal DCLK, and the pulse generator 703 can be controlled by the desired clock signal DCLK to optimize the sampling time of the sample and hold circuit 200. It should be noted that, although the sample and hold circuit 200 shown in FIG. 7 utilizes the recovery clock signal from a transmitter as the clock source of the digital controlled delay line 701, this is not meant to limit the present invention. The circuit shown in FIG. 7 can be utilized in other structures, and other clock signals can be utilized as the clock source of the digital controlled delay line 701.

Figure 8:
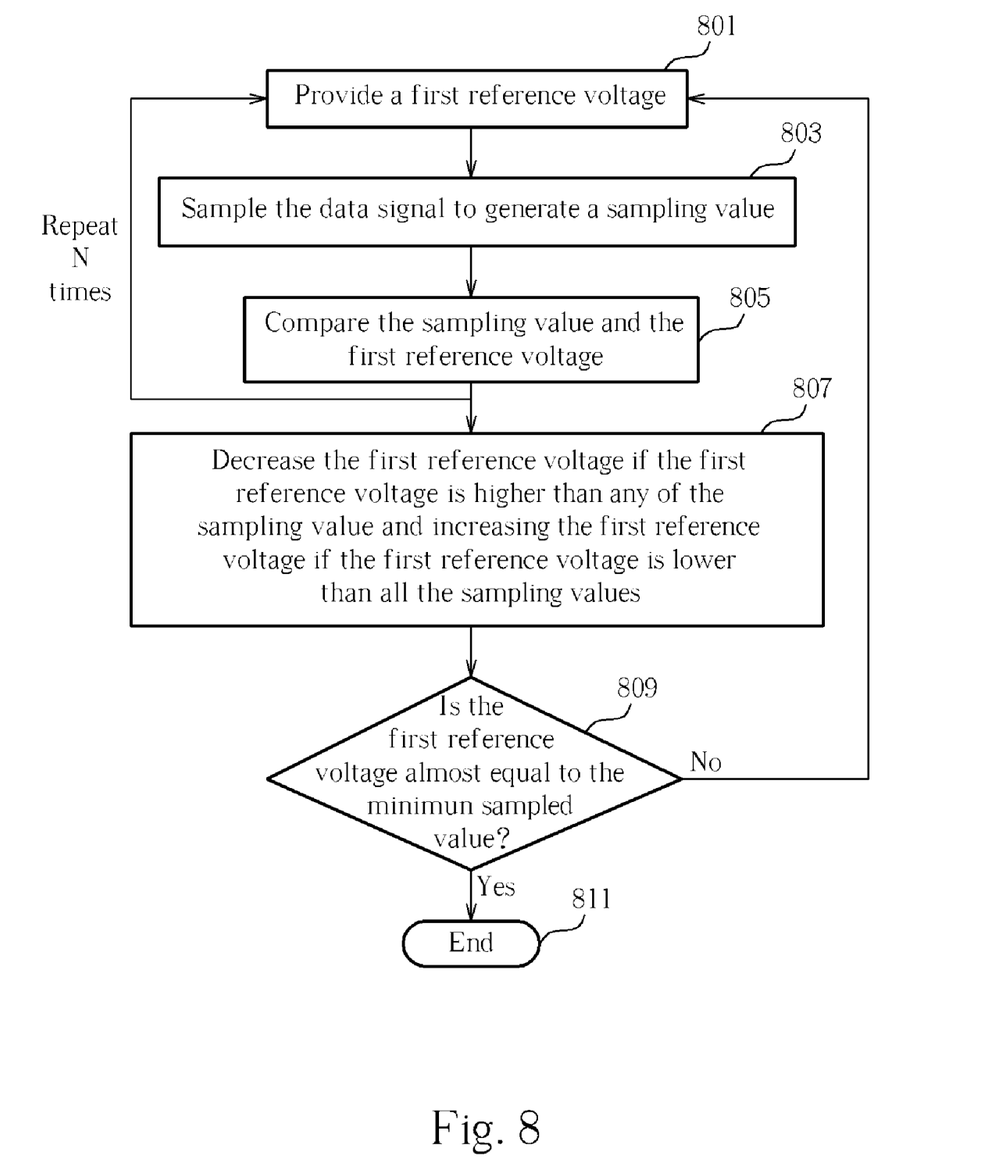
FIG. 8 is a flow chart illustrating a data signal detecting method corresponding to the sample and hold circuit shown in FIG. 2.

FIG. 8 is a flow chart illustrating a data signal detecting method corresponding to the sample and hold circuit shown in FIG. 2. As shown in FIG. 8, the method comprises:

Step 801

Provide a first reference voltage.

Step 803

Sample the data signal to generate a sampled value.

Step 805

Compare the sampled value and the first reference voltage.

In one embodiment, steps 801, 803, 805 can be repeated for specific times and obtain a set of comparing values. Then enter step 807.

Step 807

Decrease the first reference voltage if the first reference voltage is higher than any of the sampled values and increase the first reference voltage if the first reference voltage is lower than all the sampled values.

In one embodiment, steps 801, 803,805,806,807 are repeated until the first reference voltage is almost equal to the minimum sampled value.

As described above, the method shown in FIG. 8 corresponds to the circuit shown in FIG. 2. If the method corresponds to the circuit shown in FIG. 5, it further comprises: comparing the sampled value and a second reference voltage lower than the first reference voltage level; and invalidating the data signal if the sampled value is lower than the second reference voltage.

Similarly, if the method corresponds to the circuit shown in FIG. 7, it further comprises: receiving a clock signal and delaying the clock signal to generate a desired clock signal according to a control word; and adjusting the sampling time of the data signal detecting method according to the desired clock signal.

Other detailed characteristics of the data signal detecting method will be easily obtained according to the above-mentioned description, and are thus omitted for brevity.

Figure 9A:
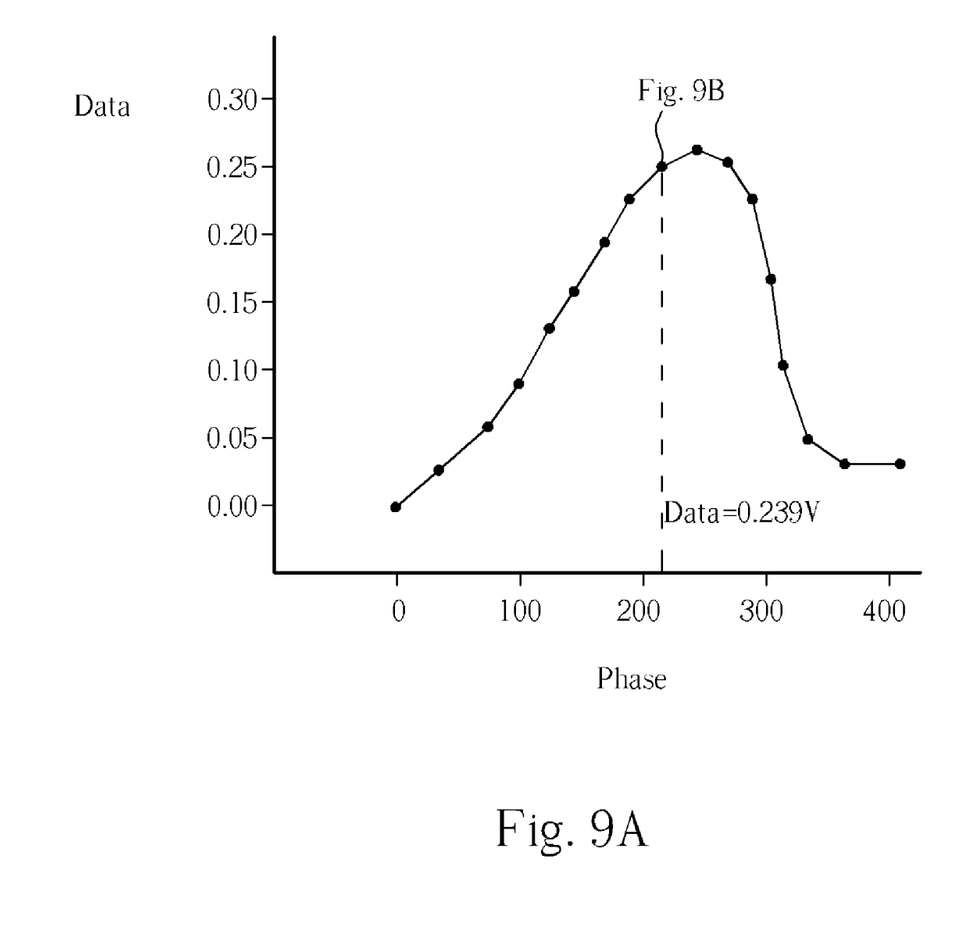
FIG. 9A is a schematic diagram illustrating the simulation result of the sample and hold circuit shown in FIG. 2.
Figure 9B:
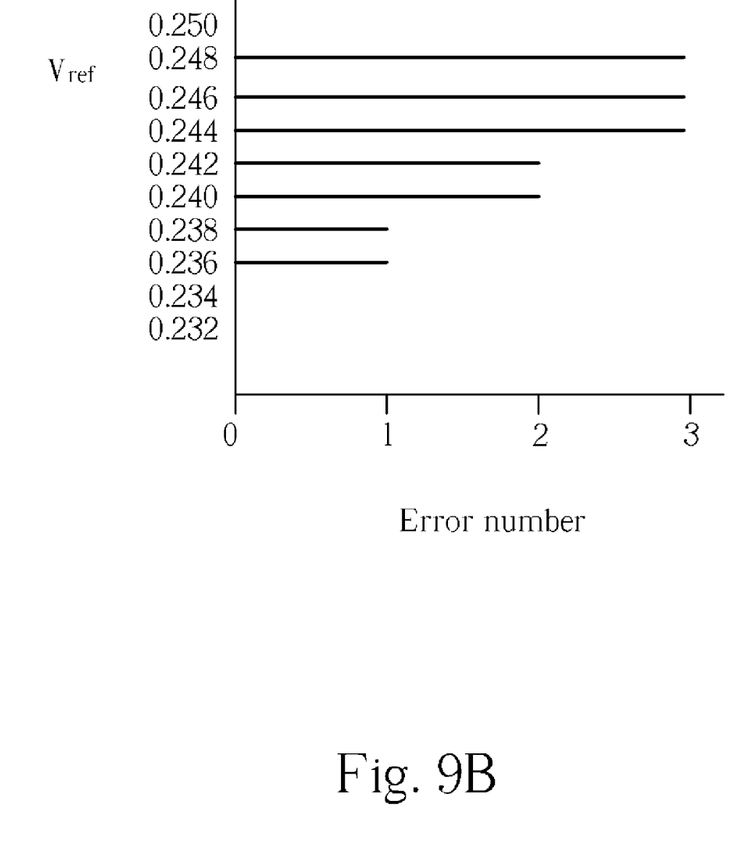
FIG. 9B is a diagram illustrating the relation of different reference voltages and data signal height.

FIG. 9A is a schematic diagram illustrating the simulation result of the sample and hold circuit shown in FIG. 2. The horizontal axis of FIG. 9A is the sampling phase, and the vertical axis of FIG. 9A is the value of a data signal. FIG. 9B shows the data error number (that is the number of comparing results that the data is lower than the first reference voltage $V_{ref1}$) occurs for different $V_{ref1}$, and the $V_{ref1}$, which has a next $V_{ref1}$ having zero error number, indicates the real data signal height. As shown in FIG. 9A, the $V_{ref}$ 0.236V has an error number 1 and the $V_{ref}$ 0.234V has an error number 0, thus the $V_{ref}$ 0.236V indicates the real data signal height. In this case, the real data signal height is 0.239 V, and the reason for this inaccuracy is non-avoidable elements and circuit inaccuracy. Such a minor error can be ignored or avoided by utilizing precise elements, if necessary.

Figure 10:
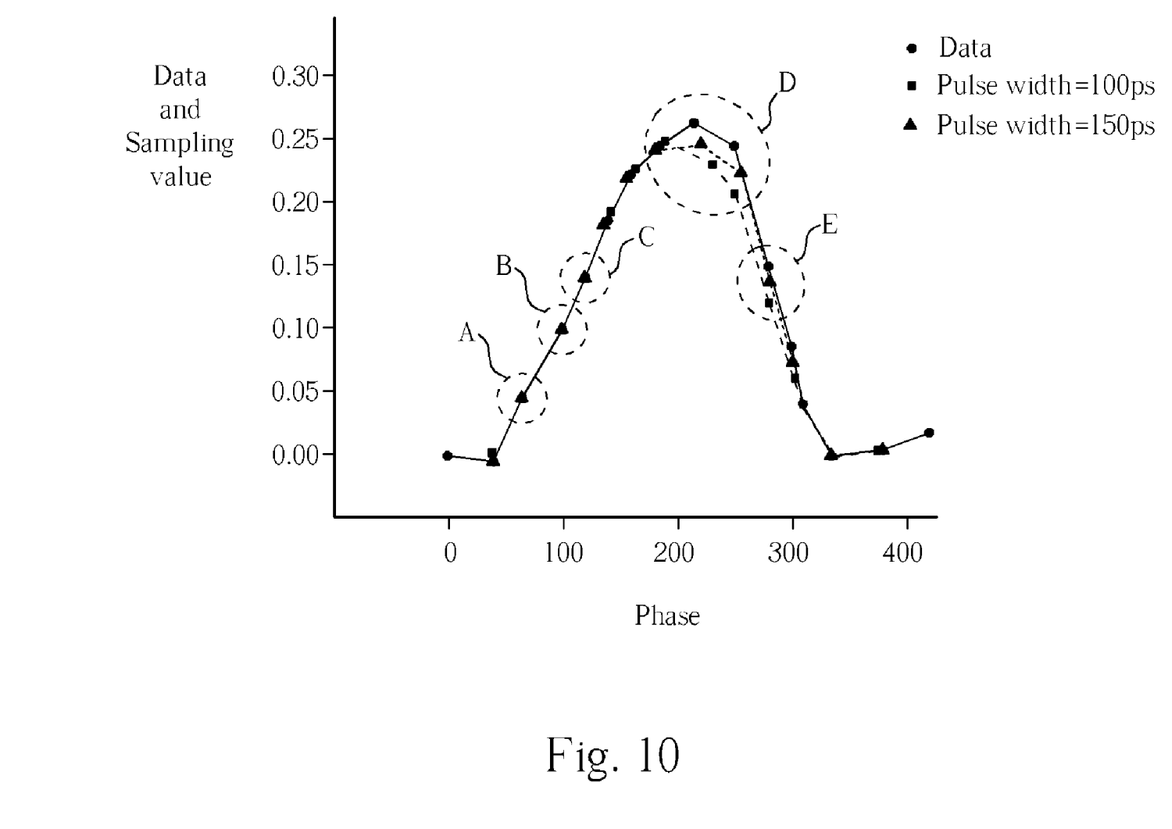
FIG. 10 is schematic diagram illustrating the sampling result of the sample and hold circuit shown in FIG. 2.

FIG. 10 is a schematic diagram illustrating the sampling result of the sample and hold circuit 200 shown in FIG. 2. The horizontal axis of FIG. 9A is the sampling phase, and the vertical axis of FIG. 9A is the sampled value and the real data value. A circular point ● indicates the real data value, a triangular point ▲ indicates the sampled value from a pulse signal with a width=100 ps, and a square point ■ indicates the sampled value from a pulse signal with a width=150 ps. As shown in FIG. 10, in some regions such as regions A, B and C, the three values are similar or the same, but in other regions such as region D or E, the three values are different. The reason for this situation is that the data signal has a curved region and the sampled value is the average value of the whole pulse width. Thus, if the pulse range includes the curved region of the data signal, the sampled value will be decreased, and a difference between the real data value and the sampled value will occur. Thus the width of a pulse signal should be well selected to meet the balance of the processing speed of circuit and data accuracy.

According to the above-mentioned circuit and structure, since the capacitor is pre-charged before the sample and hold circuit samples a data signal, the sampling problem for high speed is solved, and a comparator with lower speed can be used. Furthermore, low and high levels of the data signal can be easily determined by the application of only two comparators and reference voltages according to the present invention. Moreover, the width of the eye diagram can be easily measured by utilizing the DCDL.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A sample and hold circuit, for detecting a parameter of a data signal, comprising:

a first switching module, wherein the sample and hold circuit samples the data signal according to turning on or turning off of the first switching module;

at least one capacitor, coupled to the first switching module;

a second switching module, coupled to the at least one capacitor;

a controllable reference voltage source, for providing a first reference voltage to charge/discharge the at least one capacitor via the second switching module according to a control signal;

a first comparator, coupled to the at least one capacitor, for comparing a voltage drop on the at least one capacitor and the first reference voltage to generate a first comparing result; and a control circuit, coupled to the controllable reference voltage source and the first comparator, for generating the control signal according to the first comparing result.

2. The sample and hold circuit of claim 1, wherein the parameter is a height of an eye diagram of the data signal.

3. The sample and hold circuit of claim 1, further comprising:

a second comparator, coupled to the capacitor, for comparing the data signal and a second reference voltage to generate a second comparing result; and a decision circuit, coupled to the first comparator and the second comparator, for validating the data signal according to the first comparing result and the second comparing result.

4. The sample and hold circuit of claim 1, further comprising:

a digital controlled delay line, for receiving a clock signal and delaying the clock signal to generate a desired clock signal according to a control word; and a pulse generator, coupled to the digital controlled delay line, the first switching module and the second switching module, for generating pulse signals to control the first switching module and the second switching module according to the desired clock signal to adjust the sampling time of the sample and hold circuit.

5. The sample and hold circuit of claim 1, wherein the parameter is a height or a width of an eye diagram of the data signal.

6. The sample and hold circuit of claim 1, being located between a transmitter of the data signal and a receiver of the data signal.

7. The sample and hold circuit of claim 6, further comprising:

a digital controlled delay line, for receiving a clock signal and delaying the clock signal to generate a desired clock signal according to a control word, wherein the clock signal is a recovery clock signal from the receiver; and a pulse generator, coupled to the digital controlled delay line, the first switching module and the second switching module, for generating pulse signals to control the first switching module and the second switching module according to the desired clock signal to adjust the sampling time of the sample and hold circuit.

8. The sample and hold circuit of claim 7, wherein the parameter is a height or a width of an eye diagram of the data signal.

9. A data signal detecting method for detecting a parameter of a data signal, comprising:

(a) providing a first reference voltage;
(b) sampling the data signal to generate a sampled value;
(c) comparing the sampled value and the first reference voltage;
(d) repeating the step (a), the step (b) and the step (c) for a predetermined number of times;
(e) decreasing the first reference voltage if the first reference voltage is higher than any of the sampled values and increasing the first reference voltage if the first reference voltage is lower than all the sampled values.

10. The data signal detecting method of claim 9, wherein the parameter is a height of an eye diagram of the data signal.

11. The data signal detecting method of claim 9, further comprising:

comparing the sampled value and a second reference voltage lower than the first reference voltage level; and validating the data signal if the sampled value is lower than the second reference voltage.

12. The data signal detecting method of claim 9, further comprising:

receiving a clock signal and delaying the clock signal to generate a desired clock signal according to a control word; and adjusting the sampling time of the data signal detecting method according to the desired clock signal.

13. The data signal detecting method of claim 9, wherein the clock signal is a recovery clock signal from a receiver for receiving the data signal.

14. The data signal detecting method of claim 9, wherein the step (a), the step (b), the step (c), the step (d) and the step (e) are repeated until the first reference voltage is substantially equal to the sampled value.

* * * * *